(12) United States Patent
Barnes

(10) Patent No.: US 9,857,618 B2
(45) Date of Patent: Jan. 2, 2018

(54) DISPLAY ENCLOSURE WITH PASSIVE COOLING SYSTEM

(71) Applicant: Michael S. Barnes, Kennesaw, GA (US)

(72) Inventor: Michael S. Barnes, Kennesaw, GA (US)

( * ) Notice: Subject to any disclaimer, the term of this patent is extended or adjusted under 35 U.S.C. 154(b) by 170 days.

(21) Appl. No.: 14/715,265

(22) Filed: May 18, 2015

(65) Prior Publication Data

US 2016/0345464 A1 Nov. 24, 2016

(51) Int. Cl.
H05K 5/00 (2006.01)
G02F 1/1333 (2006.01)
H05K 7/20 (2006.01)

(52) U.S. Cl.
CPC ... G02F 1/133385 (2013.01); H05K 7/20972 (2013.01)

(58) Field of Classification Search
CPC .......... G02F 1/133385; G02F 2201/36; H05K 7/20972; H05K 7/20145; H15K 7/20136
USPC ............ 454/184, 193; 361/679.49, 690, 692, 361/694, 695; 348/836–843; 349/58, 349/161
See application file for complete search history.

(56) References Cited

U.S. PATENT DOCUMENTS

| | | | | |
|---|---|---|---|---|
| 3,010,379 A * | 11/1961 | Arzberger | ............. | A47F 3/0447 454/190 |
| 3,298,195 A * | 1/1967 | Raskhodoff | ............... | G06F 1/20 165/47 |
| 5,113,749 A * | 5/1992 | Perbix | ........................ | F24F 9/00 454/193 |
| 5,623,392 A * | 4/1997 | Ma | ..................... | G02F 1/133308 345/905 |
| 6,011,701 A * | 1/2000 | Kopp | ...................... | A47B 21/00 312/223.2 |
| 6,104,451 A * | 8/2000 | Matsuoka | ......... | G02F 1/133308 349/58 |
| 6,185,097 B1 * | 2/2001 | Behl | ........................ | G06F 1/20 361/695 |
| 6,198,222 B1 * | 3/2001 | Chang | ................ | H05K 7/20972 313/46 |
| 6,272,011 B1 * | 8/2001 | Chen | ...................... | G11B 33/08 248/611 |
| 6,668,565 B1 * | 12/2003 | Johnson | ............. | H05K 7/20581 361/695 |
| 7,072,179 B1 * | 7/2006 | Curran | ...................... | G06F 1/16 165/104.32 |
| 7,907,402 B2 * | 3/2011 | Caveney | ............ | H05K 7/20572 312/223.2 |
| 8,408,356 B2 * | 4/2013 | Yamaguchi | ........ | H05K 7/20736 181/198 |
| 8,767,165 B2 * | 7/2014 | Dunn | ..................... | G06Q 40/06 349/161 |

(Continued)

*Primary Examiner* — Vivek Shirsat

(74) *Attorney, Agent, or Firm* — Michael F. Krieger; Kirton McConkie

(57) ABSTRACT

A display enclosure can include a passive cooling system that includes an exhaust channel and a number of fans. The configuration of the exhaust channel can cause airflow to ingress through one side of the display enclosure, circulate through the display enclosure, and then egress through the same side. The exhaust channel can be positioned around the outer edges of the display enclosure to form an insulative barrier to external heat (e.g., sunlight) while at the same time removing heat generated internally.

19 Claims, 17 Drawing Sheets

(56) References Cited

U.S. PATENT DOCUMENTS

| | | | |
|---|---|---|---|
| 8,802,981 B2* | 8/2014 | Wallaert | F24F 11/00 174/489 |
| 8,926,414 B1* | 1/2015 | Kirkpatrick | H05K 7/20136 361/679.41 |
| 9,723,765 B2* | 8/2017 | DeMars | H05K 7/20972 |
| 2002/0173265 A1* | 11/2002 | Kipka | H05K 9/0041 454/184 |
| 2005/0140844 A1* | 6/2005 | Won | F21V 29/004 349/58 |
| 2005/0185245 A1* | 8/2005 | Fujimori | G02F 1/133385 359/237 |
| 2006/0018092 A1* | 1/2006 | Nagano | F16M 11/10 361/679.21 |
| 2007/0103909 A1* | 5/2007 | Park | H05K 7/20972 362/294 |
| 2007/0190921 A1* | 8/2007 | Heim, Sr. | B25H 3/02 454/184 |
| 2008/0285290 A1* | 11/2008 | Ohashi | G02B 6/0085 362/373 |
| 2009/0115919 A1* | 5/2009 | Tanaka | H05K 7/20972 348/836 |
| 2009/0244472 A1* | 10/2009 | Dunn | G02F 1/133385 349/161 |
| 2011/0019363 A1* | 1/2011 | Vahlsing | H05K 7/20972 361/695 |
| 2011/0085301 A1* | 4/2011 | Dunn | F21V 29/67 361/695 |
| 2011/0123036 A1* | 5/2011 | Barath | G10K 11/1788 381/71.3 |
| 2011/0214390 A1* | 9/2011 | Barnes | B21D 47/00 52/784.1 |
| 2012/0206687 A1* | 8/2012 | Dunn | G02F 1/133385 349/161 |
| 2012/0223877 A1* | 9/2012 | Cho | G02F 1/133385 345/102 |
| 2013/0208450 A1* | 8/2013 | Imaoku | G09F 9/35 362/97.1 |
| 2014/0295748 A1* | 10/2014 | Hubbard | G02F 1/133385 454/184 |
| 2015/0282376 A1* | 10/2015 | McMahon | H05K 7/20181 454/184 |

* cited by examiner

DISPLAY ENCLOSURE WITH PASSIVE COOLING SYSTEM

CROSS-REFERENCE TO RELATED APPLICATIONS

N/A

BACKGROUND

1. Field of the Invention

The present invention is generally directed to enclosures for digital display devices such as those used to present information at a business establishment. In particular, the present invention is directed to a display enclosure that includes a passive cooling system for cooling a display device enclosed therein.

2. Description of the Related Art

Many businesses, such as restaurants, sporting venues, amusement parks, etc., employ digital display devices to convey information to their customers. These digital display devices (hereinafter "display devices"), which are similar to flat panel televisions, allow businesses to dynamically display and update content in a simple manner.

It is oftentimes desirable to enclose the display devices in order to protect them from environmental conditions or other damage. When the display devices are enclosed, it is typically necessary to provide some type of cooling system to ensure that the display devices do not overheat. This is especially true when the display devices are installed in outdoor environments where air temperature cannot be controlled.

Prior art display enclosure designs oftentimes employ a refrigerated (or active) cooling system to prevent overheating of the display devices. Although such active cooling systems are effective, they add complexity and cost to both the manufacturing and maintenance of the enclosure.

BRIEF SUMMARY

The present invention extends to a display enclosure with a passive cooling system. The display enclosure of the present invention can be used to enclose a display device and provide cooling to the display device using a number of fans. The display enclosure can include an internal exhaust channel for circulating air through the display enclosure. The configuration of the exhaust channel can cause airflow to ingress through one side of the display enclosure, circulate through the display enclosure, and then egress through the same side.

In one embodiment, the present invention is implemented as a display enclosure that includes an inner component and an outer component. Each of the inner component and the outer component has a first side, a second side opposite the first side, a third side extending between the first and second sides, and a fourth side extending between the first and second sides opposite the third side. The inner component is configured to fit within the outer component. The inner component includes a first recessed surface and a second recessed surface that each extend along the first, third, and fourth sides of the inner component as well as along outer portions of the second side of the inner component such that the first and second recessed surfaces do not extend along a middle portion of the second side of the inner component. The first and second recessed surfaces form an exhaust channel between the inner component and the outer component when the inner component is installed within the outer component. The middle portion of the inner component includes a first set of openings forming vents into a compartment defined by the first and second recessed surfaces. One or both of the first and second recessed surfaces includes a second set of openings forming airflow inlets into the exhaust channel. The second set of openings is positioned on or adjacent to the first side of the inner component. The second side of the outer component includes a third set of openings positioned within a middle portion of the second side of the outer component. The third set of openings corresponds to the first set of openings such that air flowing through the third set of openings flows through the first set of openings. The second side of the outer component further includes a fourth set of openings positioned at opposing ends of the second side such that each opening in the fourth set is positioned within the exhaust channel and forms and airflow outlet from the exhaust channel.

In another embodiment, the present invention is implemented as a display enclosure that includes an inner component and an outer component. Each of the inner component and the outer component has a top side, a bottom side, a left side, and a right side. The inner component is configured to fit within the outer component. The inner component includes a first recessed surface and a second recessed surface that each extends along the top, left, and right sides of the inner component as well as along outer portions of the bottom side of the inner component such that the first and second recessed surfaces do not extend along a middle portion of the bottom side of the inner component. The first and second recessed surfaces form an exhaust channel between the inner component and the outer component when the inner component is installed within the outer component. The middle portion of the inner component includes a first set of openings forming vents into a compartment defined by the first and second recessed surfaces. The bottom side of the outer component includes a third set of openings positioned within a middle portion of the bottom side of the outer component. The third set of openings corresponds to the first set of openings such that air flowing through the third set of openings flows through the first set of openings. Exhaust channel outlets are formed in the bottom side of the outer component. The exhaust channel outlets are positioned at opposing ends of the bottom side of the outer component so as to be underneath the outer portions of the bottom side of the inner component along which the first and second recessed surfaces extend. Exhaust channel inlets are formed in either or both the first and second recessed surfaces on the top side of the inner component.

In another embodiment, the present invention is implemented as a display enclosure that includes an outer component having a bottom side that includes a middle portion and outer portions on opposing ends of the middle portion. The middle portion includes a number of airflow inlets. Each outer portion includes an airflow outlet. The display enclosure also includes an inner component having a bottom side that includes a middle portion and outer portions on opposing ends of the middle portion. The middle portion of the inner component includes a number of airflow inlets. A top side, left side, and right side of the inner component as well as the outer portions of the bottom side of the inner component include first and second recessed surfaces. The recessed surfaces form an exhaust channel when the inner component is contained within the outer component. The recessed surfaces include a number of exhaust channel inlets that are positioned on or adjacent to the top side of the inner component. A fan is positioned in each of the airflow outlets of the outer component. Each fan causes air to flow into the display enclosure through the airflow inlets formed in the middle portions of the inner and outer components, into the exhaust channel via the exhaust channel inlets, and out of the display enclosure via the airflow outlets.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

In this specification, the terms top, bottom, left, and right should be construed as relative terms intended to denote the orientation of a display enclosure during typical use. However, these terms should not be construed as requiring a particular side of a display enclosure to always be positioned in the referenced orientation.

Also, the Figures depict a display enclosure having a rectangular shape where the referenced top and bottom sides are the shorter sides of the rectangular shape. However, the following description would apply equally to embodiments where the top and bottom sides are the longer sides of a rectangular shaped display enclosure. Also, a display enclosure in accordance with embodiments of the present invention could have a square shape if desired.

Figure 1A:
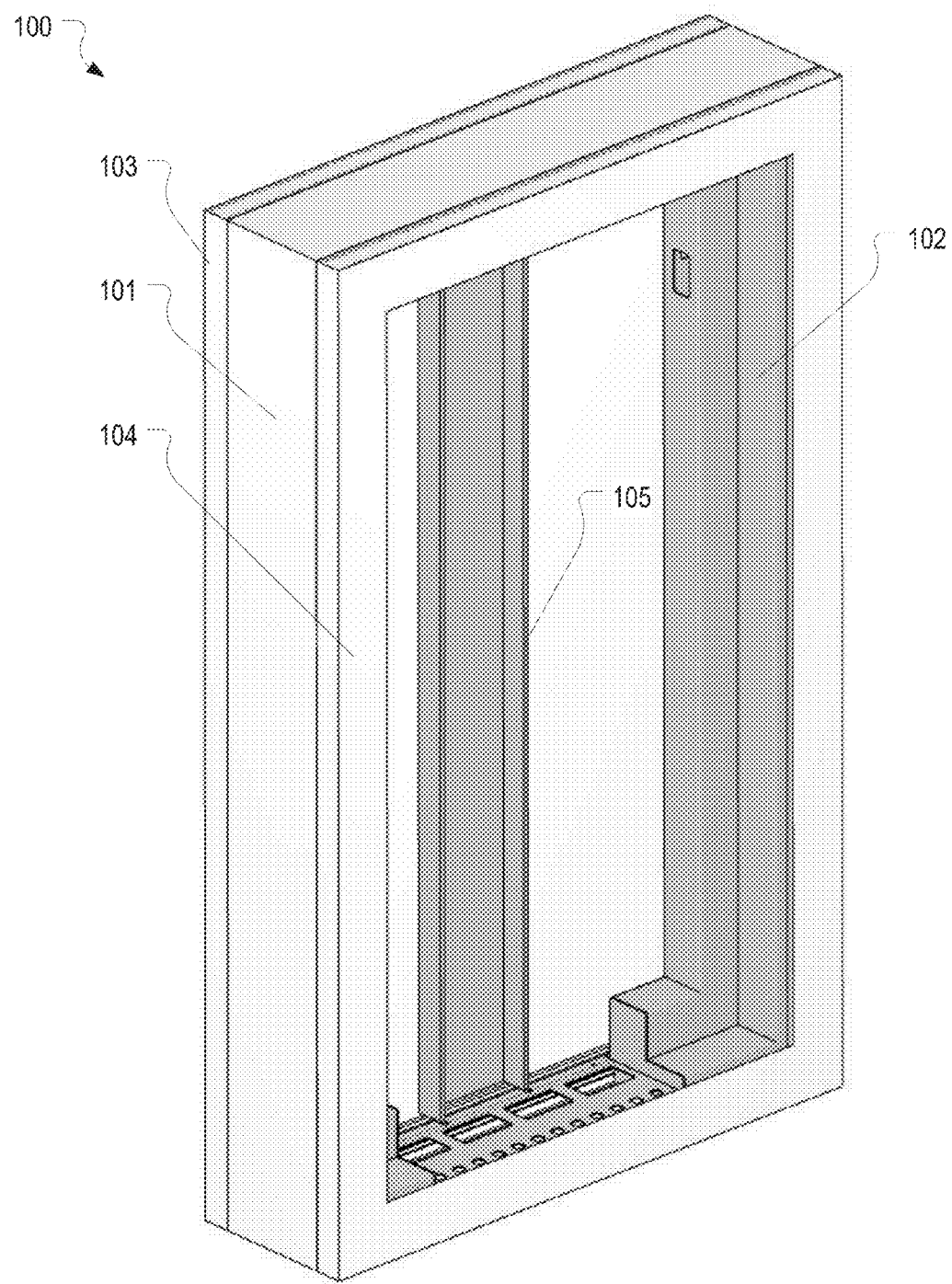
FIG. 1A illustrates a front perspective view of a display enclosure in accordance with one or more embodiments of the present invention.
Figure 1B:
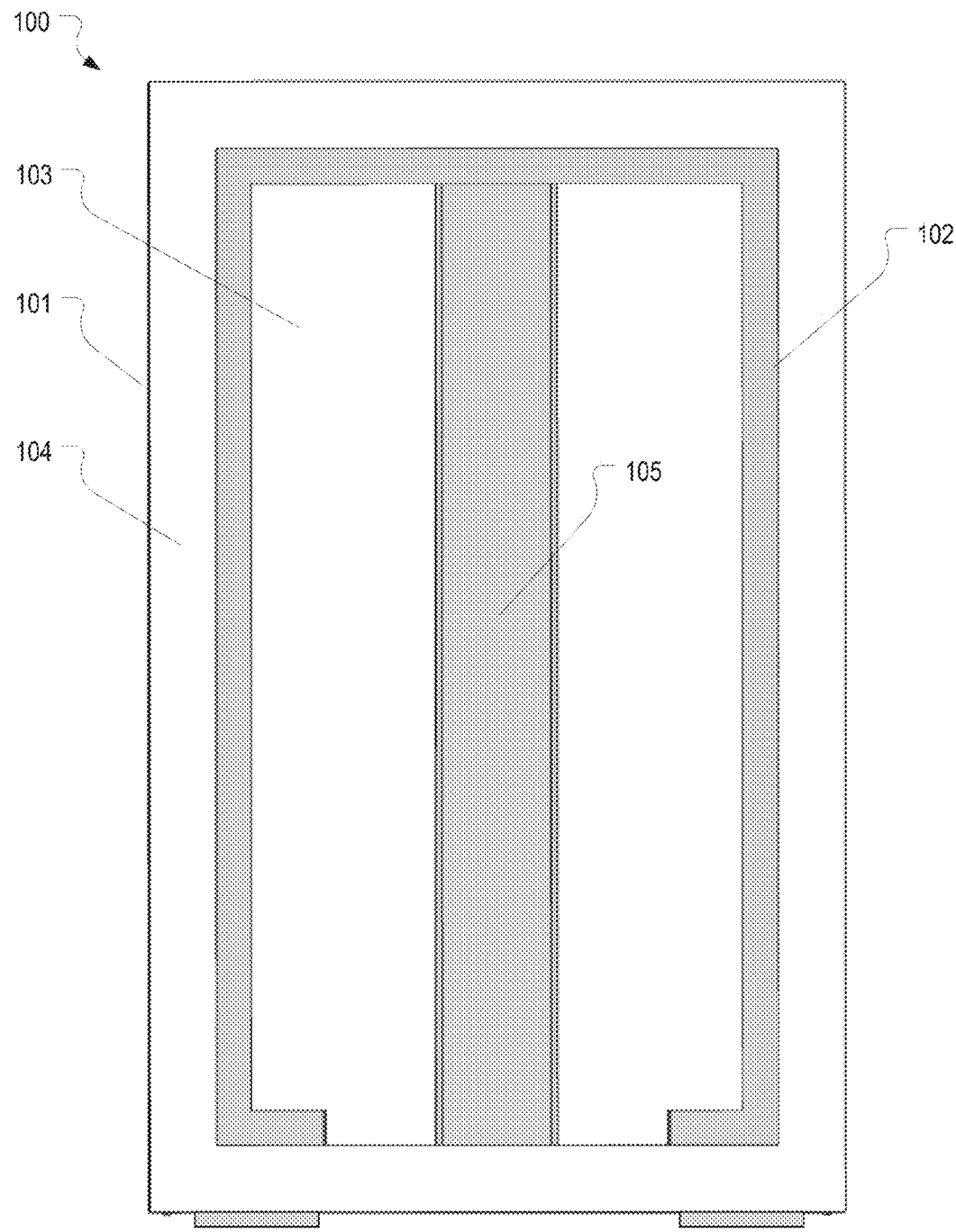
FIG. 1B illustrates a front view of the display enclosure.

FIG. 1A provides a front perspective view while FIG. 1B provides a front view of a display enclosure 100 in accordance with embodiments of the present invention. Display enclosure 100 generally comprises five components: an outer component 101, an inner component 102 that is contained within the outer component 101, a back cover 103 that encloses a back side of the outer component 101, a front cover 104 that extends around a front side of the outer component 101 and forms an opening through which an enclosed display device can be viewed, and a mounting channel 105 to which the display can be mounted when positioned within the display enclosure. In some embodiments, some of these five components could be integrally formed as a single component rather than as separate components. For example, outer component 101, back cover 103, and mounting channel 105 could be formed as a single integral component. However, it may be preferable in many embodiments that each of the five components is a separate component to facilitate installing and servicing a display device within display enclosure 100.

It is noted that display enclosure 100 can be used to enclose any type of display. Typically, the display will be a digital display device where providing cooling is a significant concern. However, display enclosure 100 could equally be used to enclose a non-digital display (e.g., a printed display). Accordingly, even though the remaining description will describe display enclosure 100 as being primarily designed to enclose a digital display device, the display enclosure of the present invention should not be limited by the type of display that it may enclose.

Figure 1C:
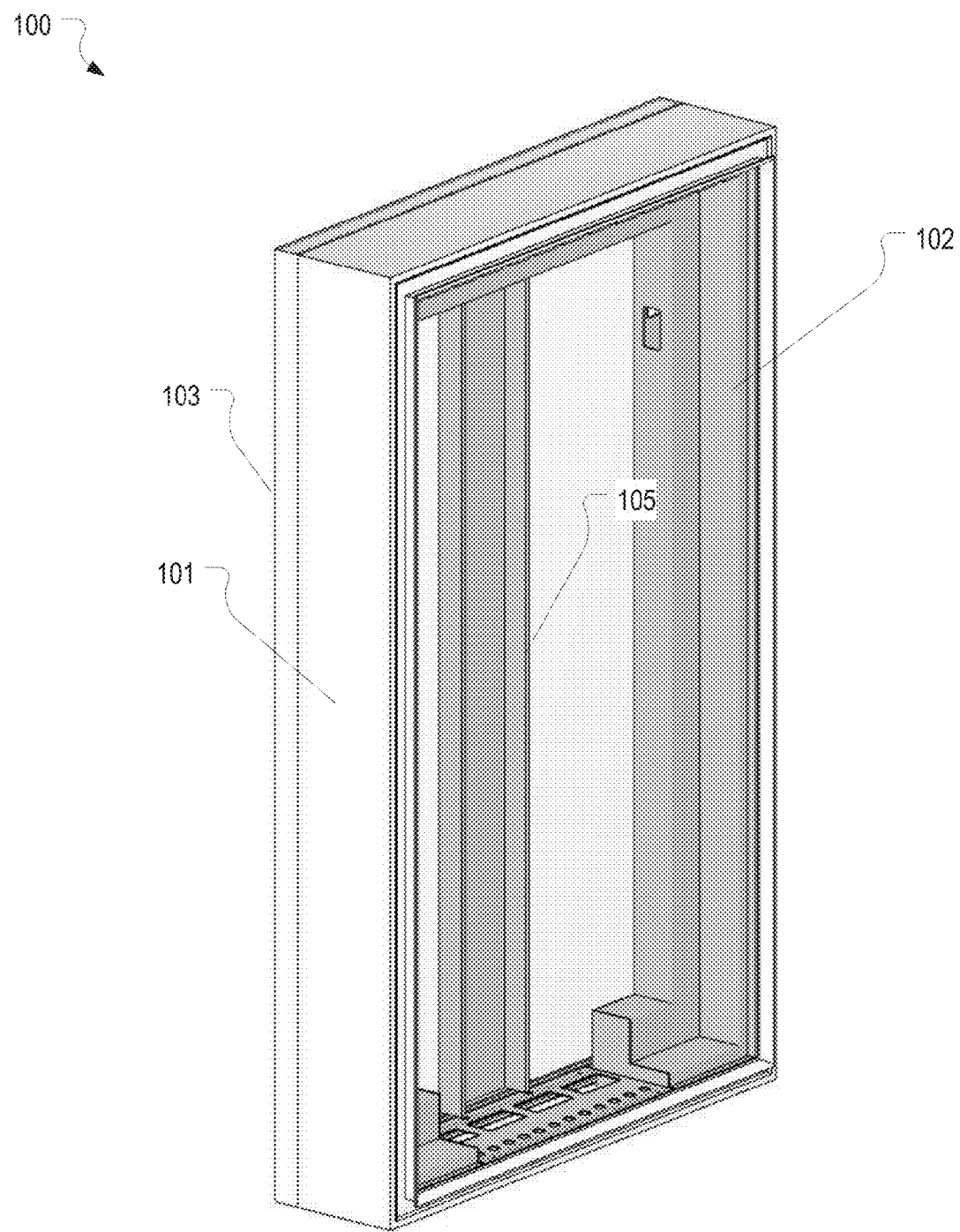
FIG. 1C illustrates a front perspective view of the display enclosure with a front cover removed.
Figure 1D:
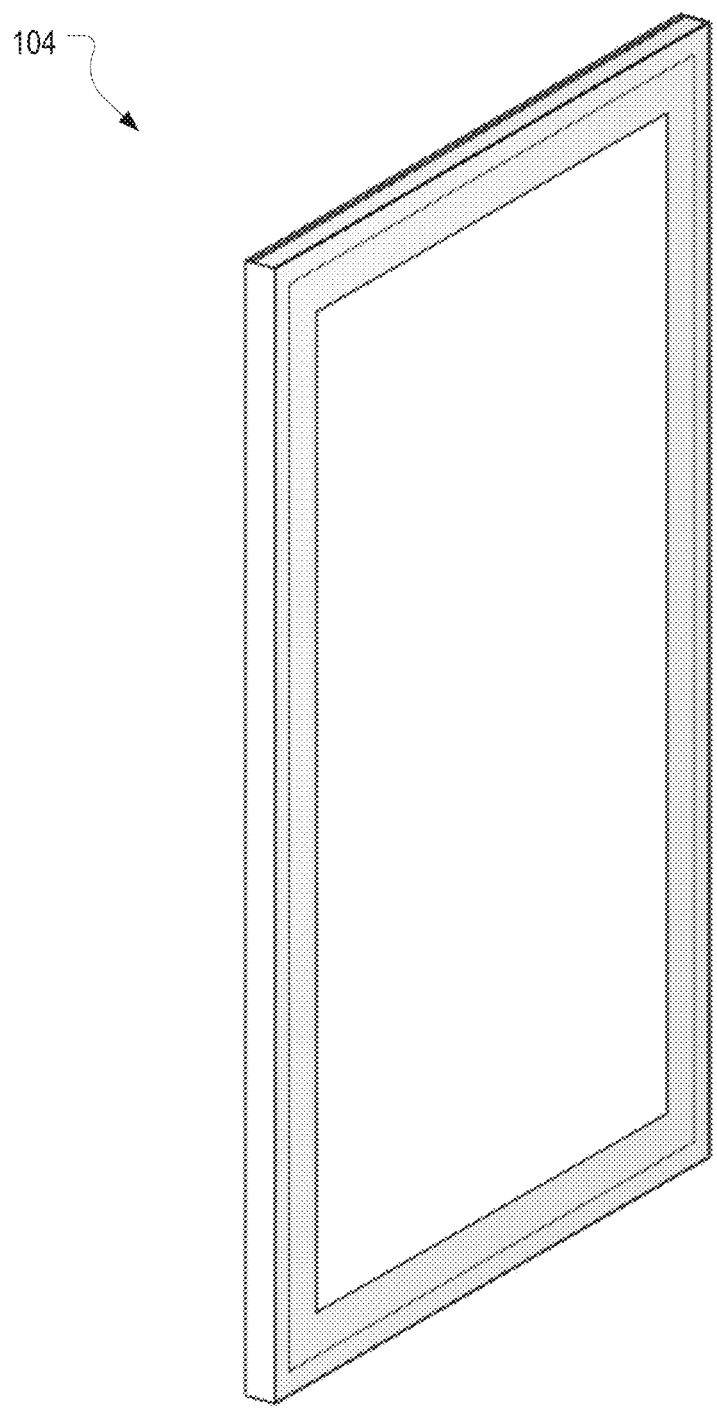
FIG. 1D illustrates the front cover of the display enclosure.
Figure 1E:
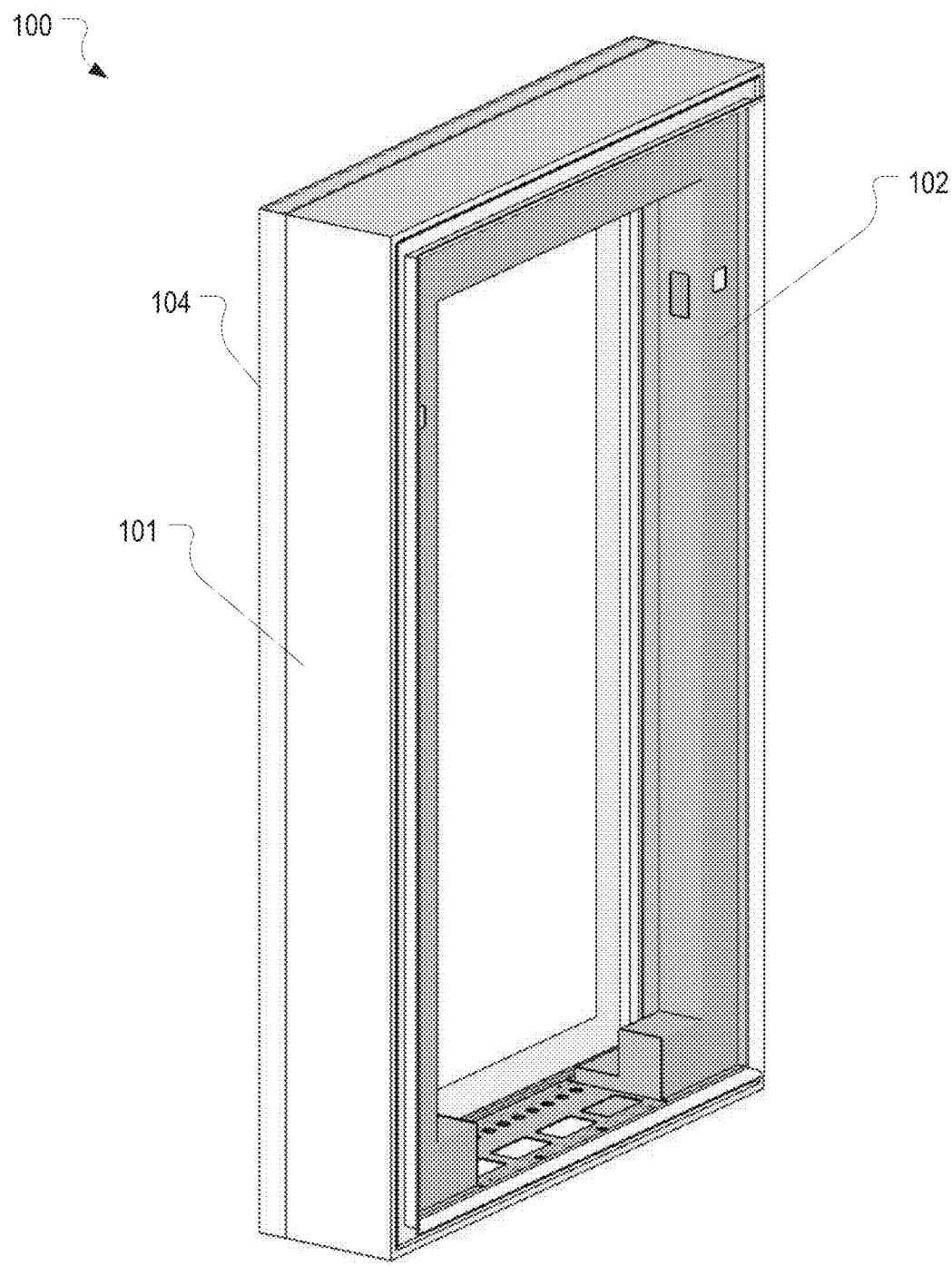
FIG. 1E illustrates a rear perspective view of the display enclosure with a back cover removed.
Figure 1F:
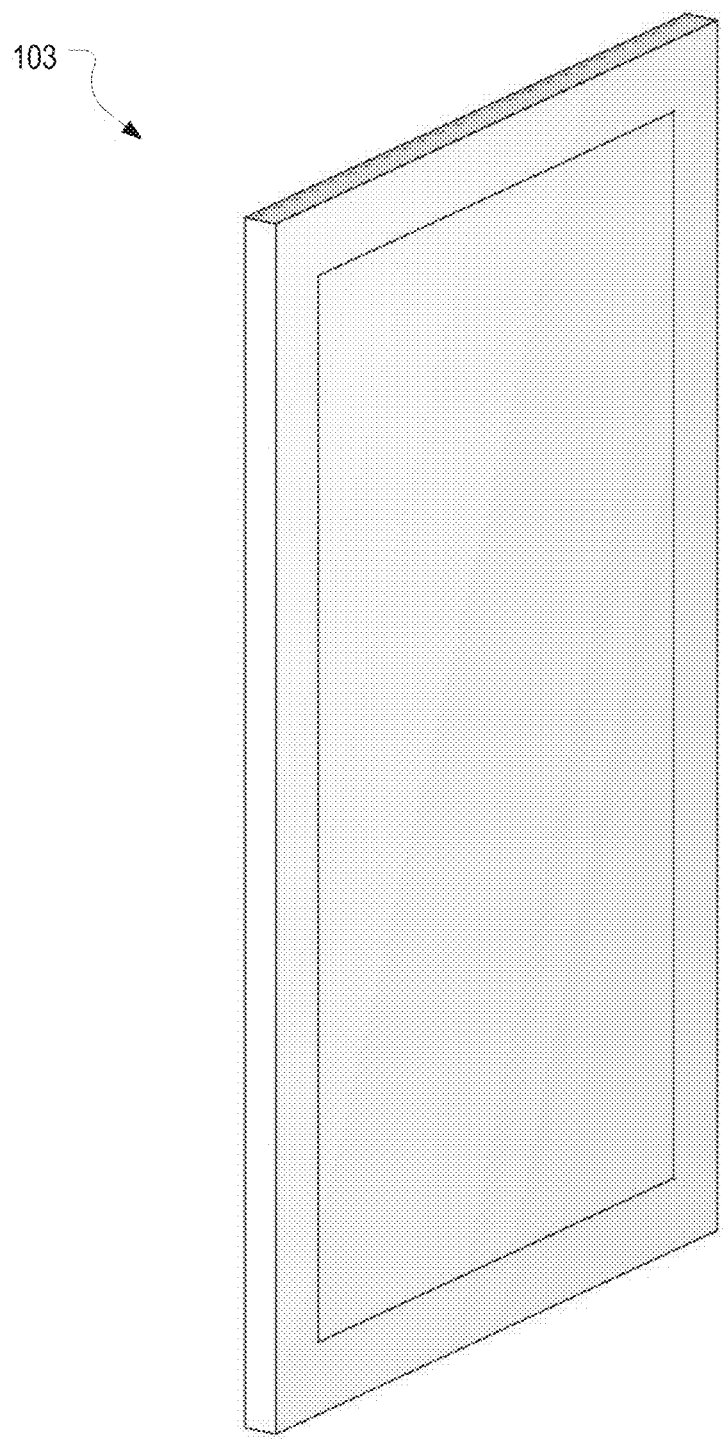
FIG. 1F illustrates the back cover of the display enclosure.

FIG. 1C provides the same view as in FIG. 1A but with front cover 104 removed, while FIG. 1D illustrates front cover 104 in isolation. Also, FIG. 1E provides a rear perspective view of display enclosure 100 with back cover 103 and mounting channel 105 removed, while FIG. 1F illustrates back cover 103 in isolation.

Outer component 101 and inner component 102 can be sized and shaped to allow inner component 102 to be contained within outer component 101. Once installed within outer component 101, inner component 102 can provide two general functions. First, inner component 102 can form a compartment within which a display device may be positioned. Second, inner component 102 can form an exhaust channel that extends around this compartment. The exhaust channel can facilitate the circulation of air through the compartment thereby cooling the display device enclosed therein.

FIGS. 2A-2E illustrate various views of inner component 102 in isolation, while FIGS. 3A-3E illustrate various views of outer component 101 in isolation.

Figure 2A:
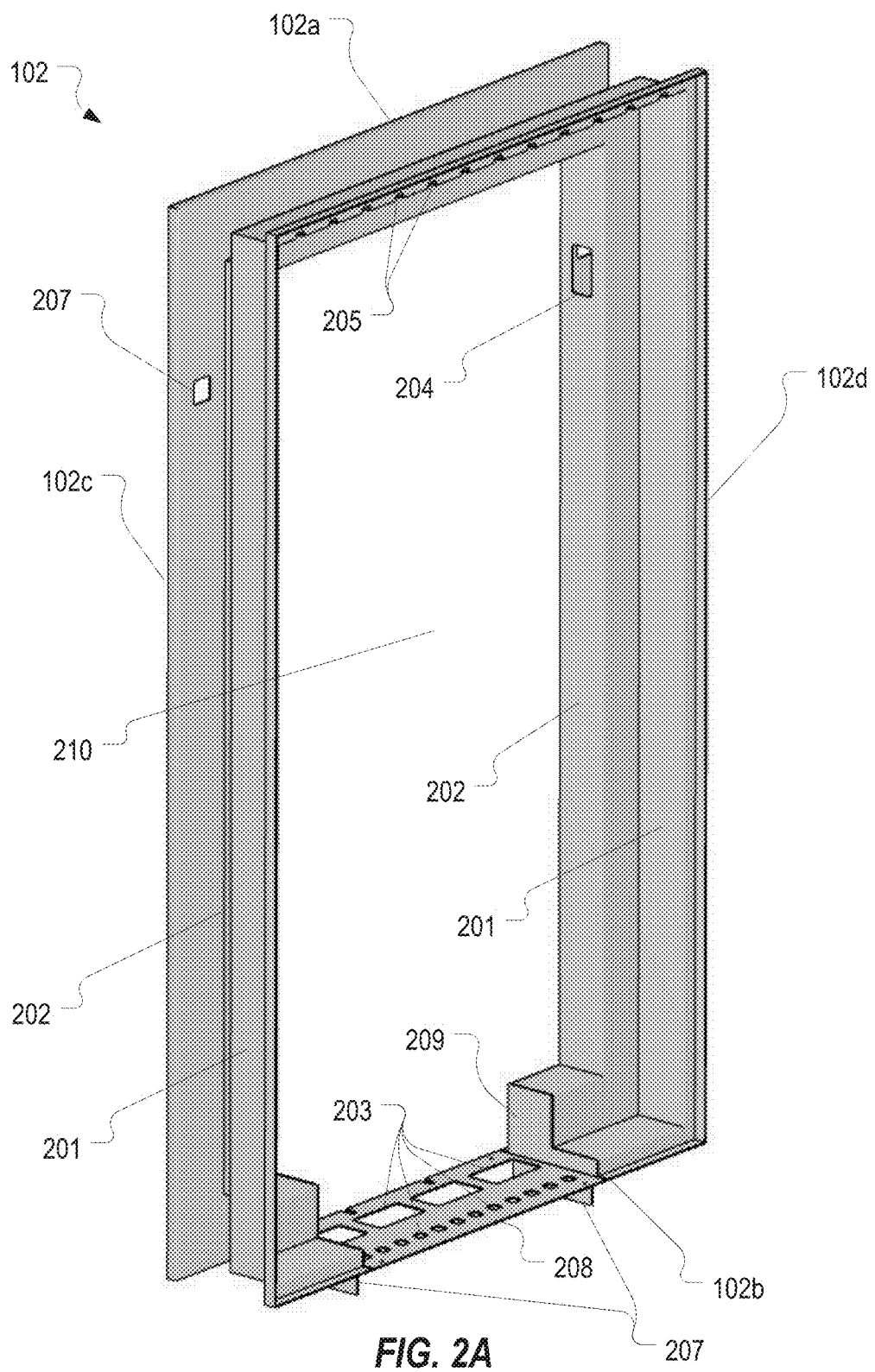
FIG. 2A illustrates a front perspective view of an inner component of the display enclosure.
Figure 2B:
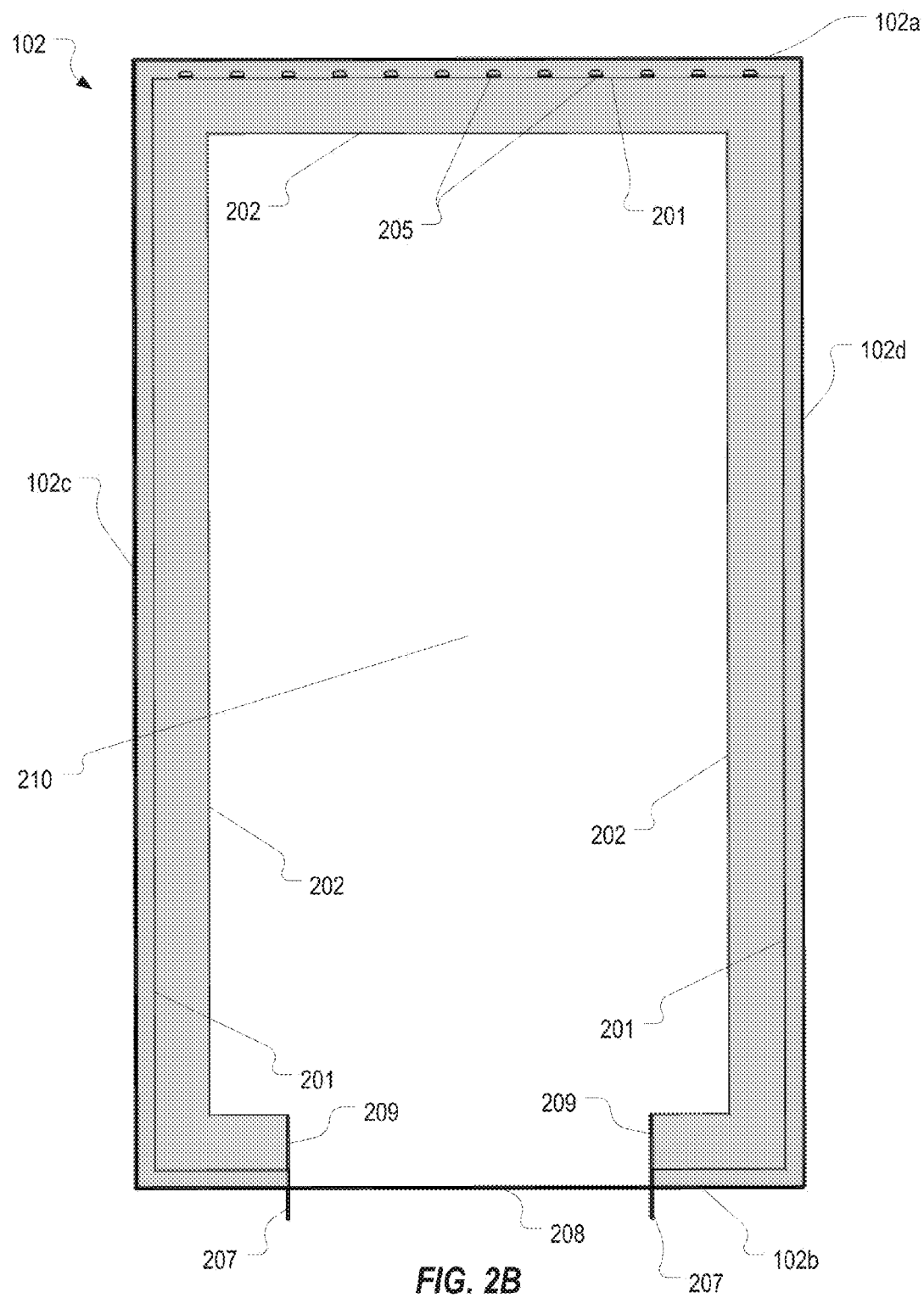
FIG. 2B illustrates a front view of the inner component.
Figure 2C:
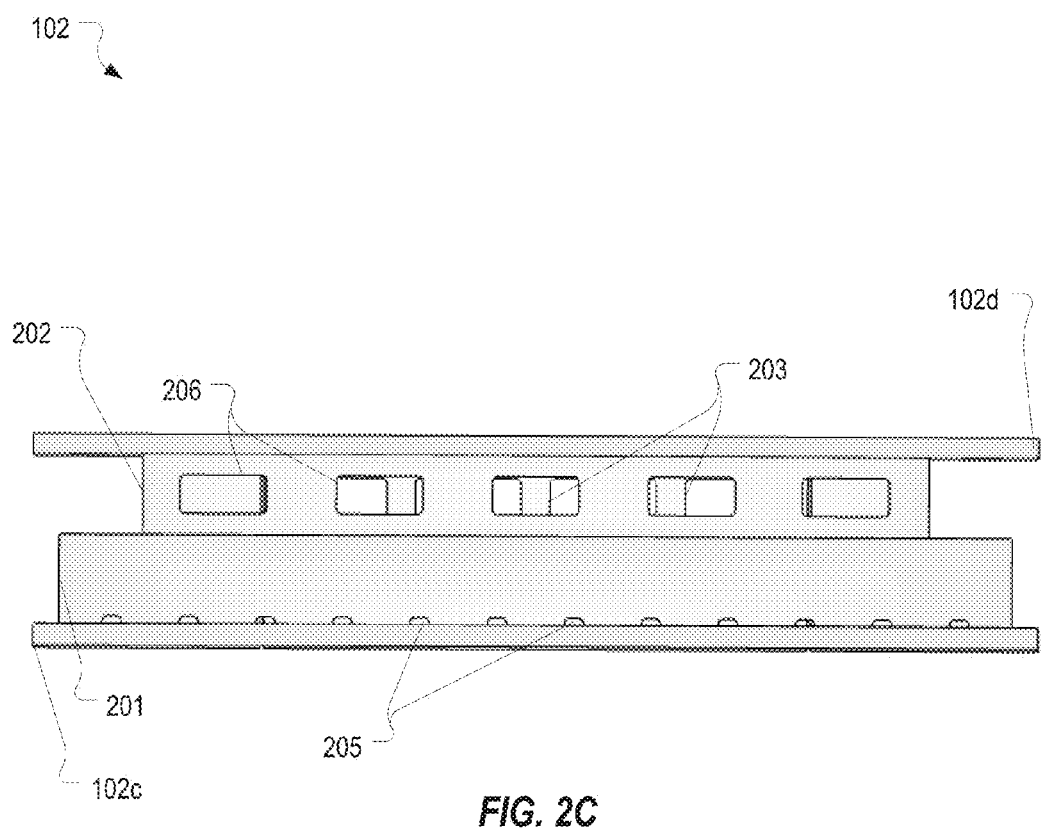
FIG. 2C illustrates a top view of the inner component.
Figure 2D:
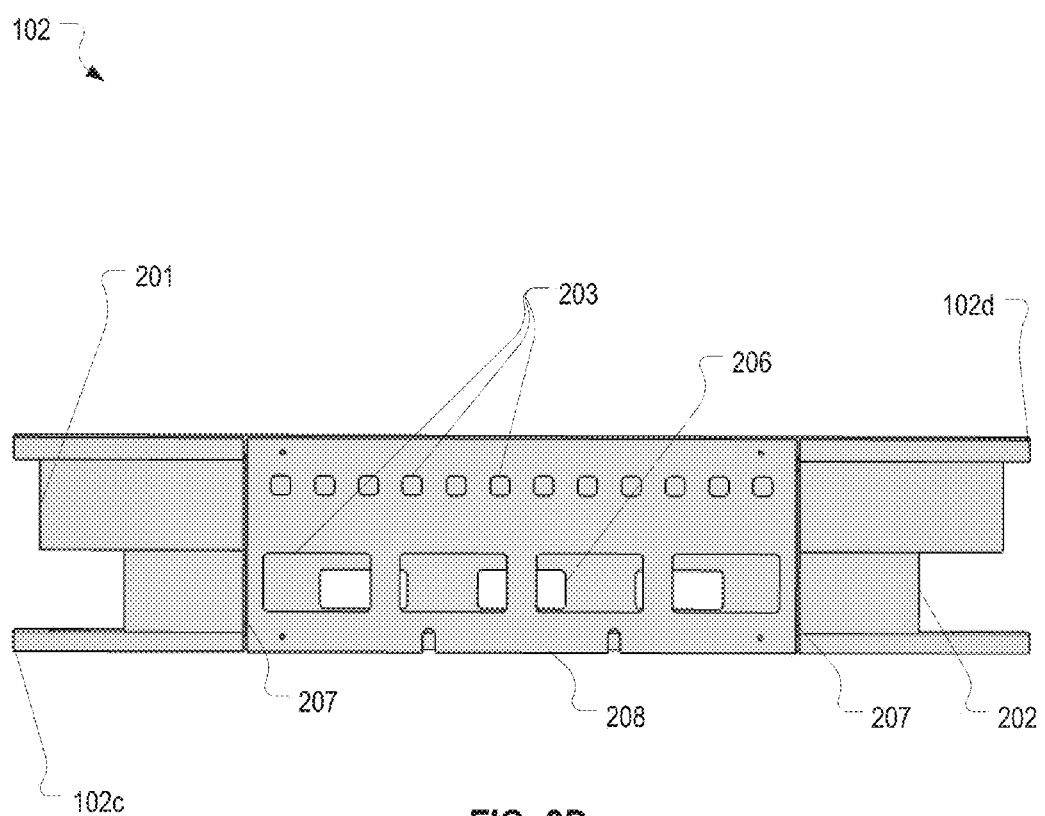
FIG. 2D illustrates a bottom view of the inner component.

As shown in FIGS. 2A-2E, inner component 102 includes a top side 102$a$, a bottom side 102$b$, a left side 102$c$, and a right side 102$d$. Bottom side 102$b$ includes a number of vents 203 through which outside air may flow into the compartment 210 formed within inner component 102. The outer surfaces of top side 102$a$, left side 102$c$, and right side 102*d* as well as a portion of the outer surface of bottom side 102*b* include a first recessed surface 201 and a second recessed surface 202. As best seen in FIGS. 2C and 2D, first recessed surface 201 and second recessed surface 202 are positioned inwardly from the outer surfaces of inner component 102. In this way, when inner component 102 is contained within outer component 101, these recessed surfaces 201, 202 form an exhaust channel between outer component 101 and inner component 102 through which air can flow. Although the recessed surfaces 201, 202 are shown as extending along the full length of top side 102*a*, in some embodiments, these recessed surfaces may extend along only a portion of top side 102*a* (e.g., similar to how they extend along bottom surface 102*b*).

The depth of first recessed surface 201 (with respect to each of the sides as well as with respect to the front surface of inner component 102 and/or front cover 104) can correspond generally to the size of a display device that is intended to be installed within display enclosure 100. Accordingly, the inner dimensions of first recessed surface 201 defines the size of compartment 210. In contrast, the depth of second recessed surface 202 (with respect to each of the sides) is greater than the depth of first recessed surface 201. This additional depth of second recessed surface 201 increases the cross-sectional area of the exhaust channel thereby facilitating increased airflow. Accordingly, as best seen in the front view of FIG. 2B, when a display device is installed within display enclosure 210, second recessed surface 202 will be positioned inwardly of the outer edges of the display device. In other words, the exhaust channel formed by recessed surfaces 201,202 will be positioned both around the outer edges of the display device as well as partially behind the back surface of the display device.

As stated above, recessed surfaces 201, 202 extend only partially around bottom side 102*b* to terminal ends 209. Terminal ends 209 are enclosed to prevent air flow into the exhaust channel through terminal ends 209. The portion of bottom side 102*b* along which recessed surfaces 201, 202 do not extend forms an inlet area 208 for airflow into compartment 210. As best seen in FIG. 2D, inlet area 208 includes a number of openings 203 forming airflow vents into compartment 210. Openings 203 can be of different shapes and sizes as shown and may include an air filter for removing dust and other particles from the air as it flows into compartment 210.

Bottom side 102*b* can also include one or more extensions 207 which extend downwardly from bottom side 102*b*. Extensions 207 can be configured to insert within corresponding openings within outer component 101 thereby securing inner component 102 within outer component 101.

Inner component 102 can include a number of additional openings 204-207 that form airflow vents into the exhaust channel formed by recessed surfaces 201, 202. To ensure that air flows completely through compartment 210, these additional openings 204-207 can be formed at or near top side 102*a*. In this way, air can only enter into the exhaust channel after flowing from inlet area 208, through compartment 210, and towards top side 102*a*. This airflow will therefore remove a substantial amount of heat from the display device and from within compartment 210 and carry this heat into the exhaust channel.

Openings 204 can be formed within second recessed surface 204 on left side 102*c* and right side 102*d* as is best seen in FIG. 2A (with only the opening on right side 102*d* being visible). Openings 205 can be formed at and/or within the interface between first recessed surface 201 and the front surface of inner component 101 as is best seen in FIG. 2C.

Figure 2E:
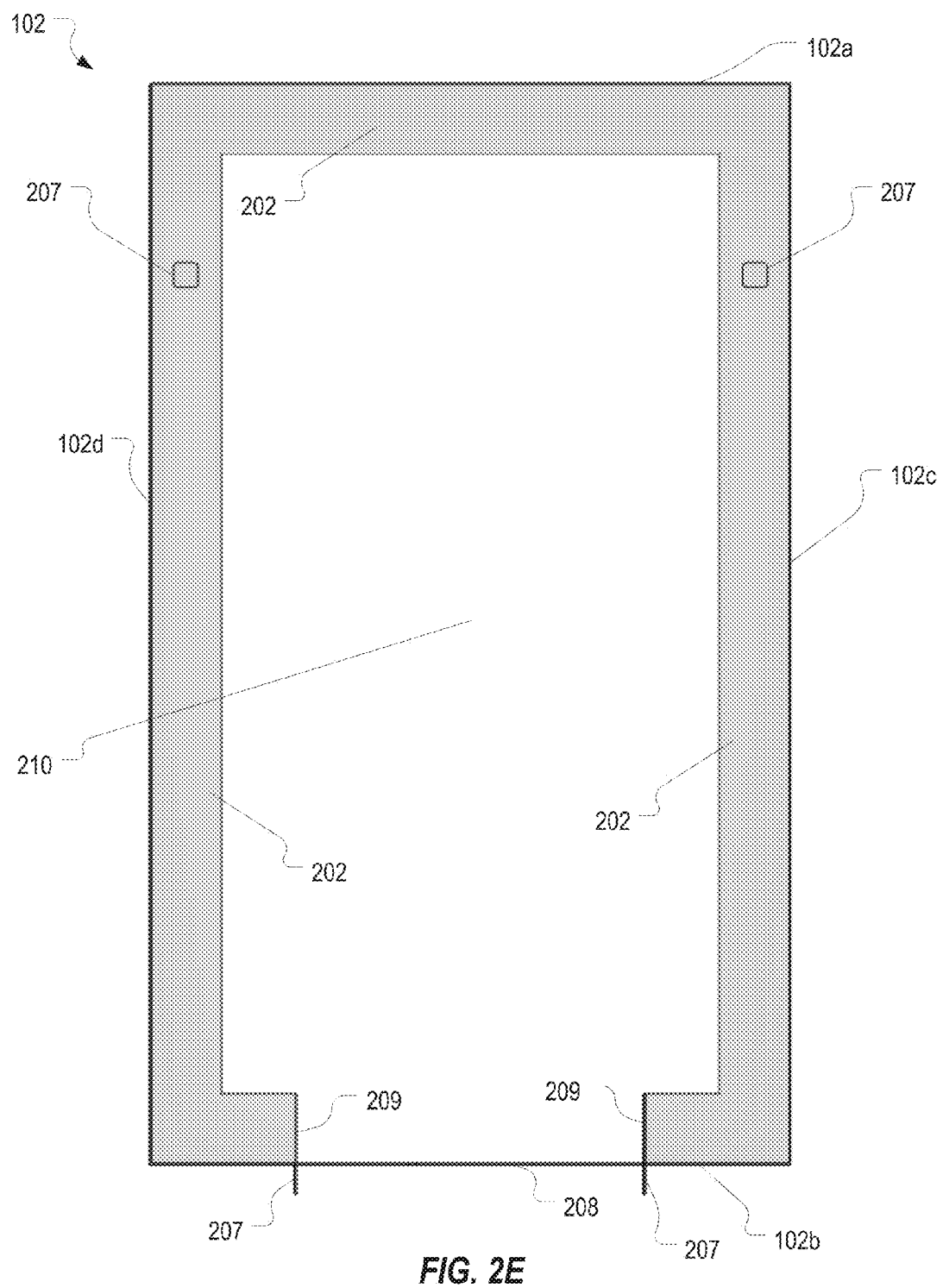
FIG. 2E illustrates a rear view of the inner component.

Openings 206 can be formed within second recessed surface 204 on top side 102*a* as best seen in FIG. 2C. Finally, in some embodiments, openings 207 can be formed within a back side of inner component 102 as best shown in FIG. 2E. Openings 207 can be employed in embodiments where a gap exists between back cover 103 and the back surface of inner component 102. Although openings 207 are formed along left side 102*c* and right side 102*d*, they could also or alternatively be formed along top side 102*a*.

Outer component 101 can have inner dimensions that conform to the outer dimensions of inner component 102 such that, when inner component 102 is contained within outer component 101, the exhaust channel formed by recessed surfaces 201, 202 is substantially sealed. In this way, air will be forced to flow upwardly from inlet area 208 and into the exhaust channel via openings 204-207.

Outer component 101 includes a top side 101*a*, a bottom side 101*b*, a left side 101*c*, and a right side 101*d*. A front flange 304 can extend forwardly along the front periphery of each side, while a back flange 305 can extend rearwardly along the back periphery of each side to allow front cover 104 and back cover 103 to be coupled to outer component 101 respectively. Outer component 101 may also be configured in other manners to allow the front and back covers to be coupled thereto.

Figure 3A:
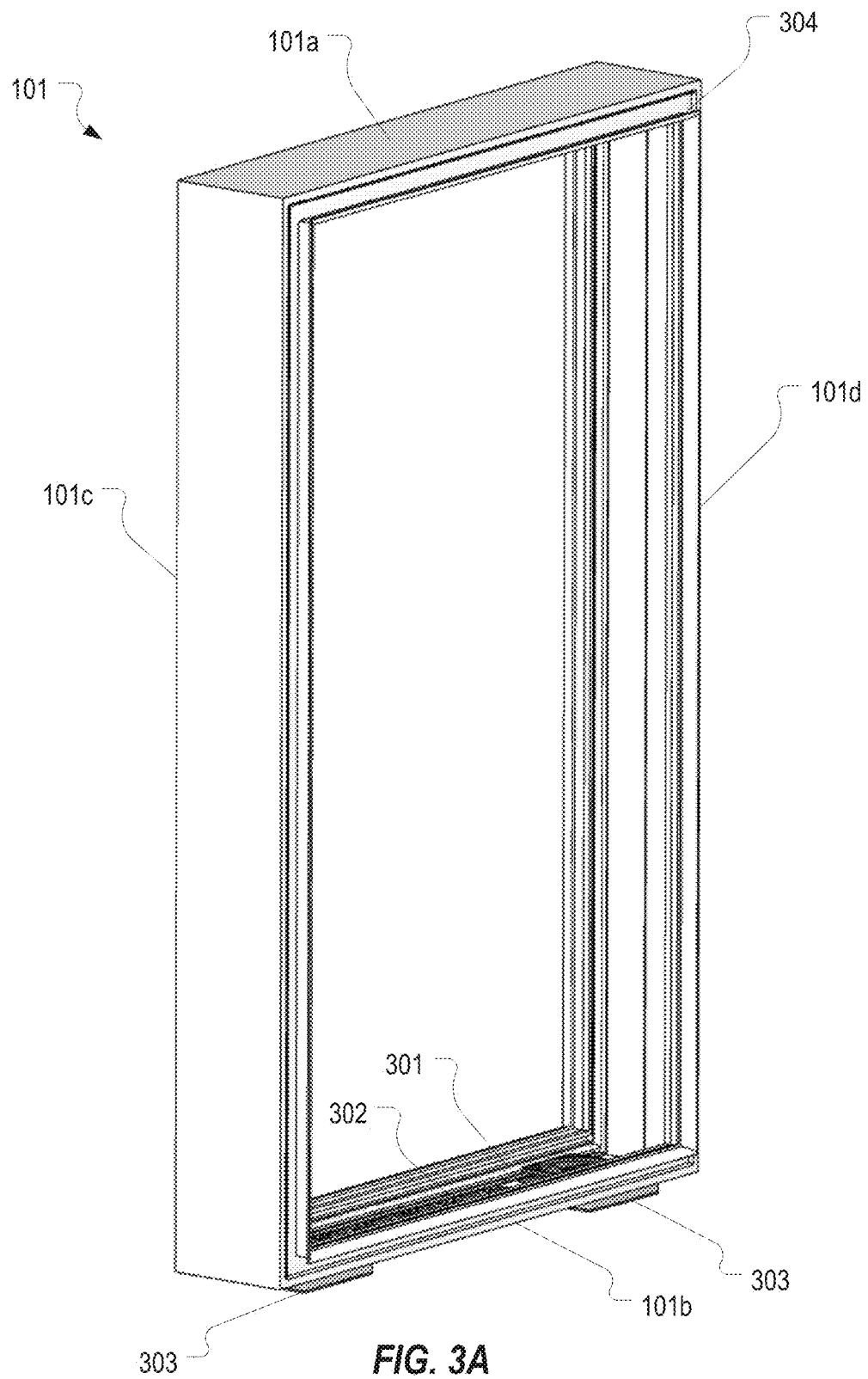
FIG. 3A illustrates a front perspective view of an outer component of the display enclosure.
Figure 3B:
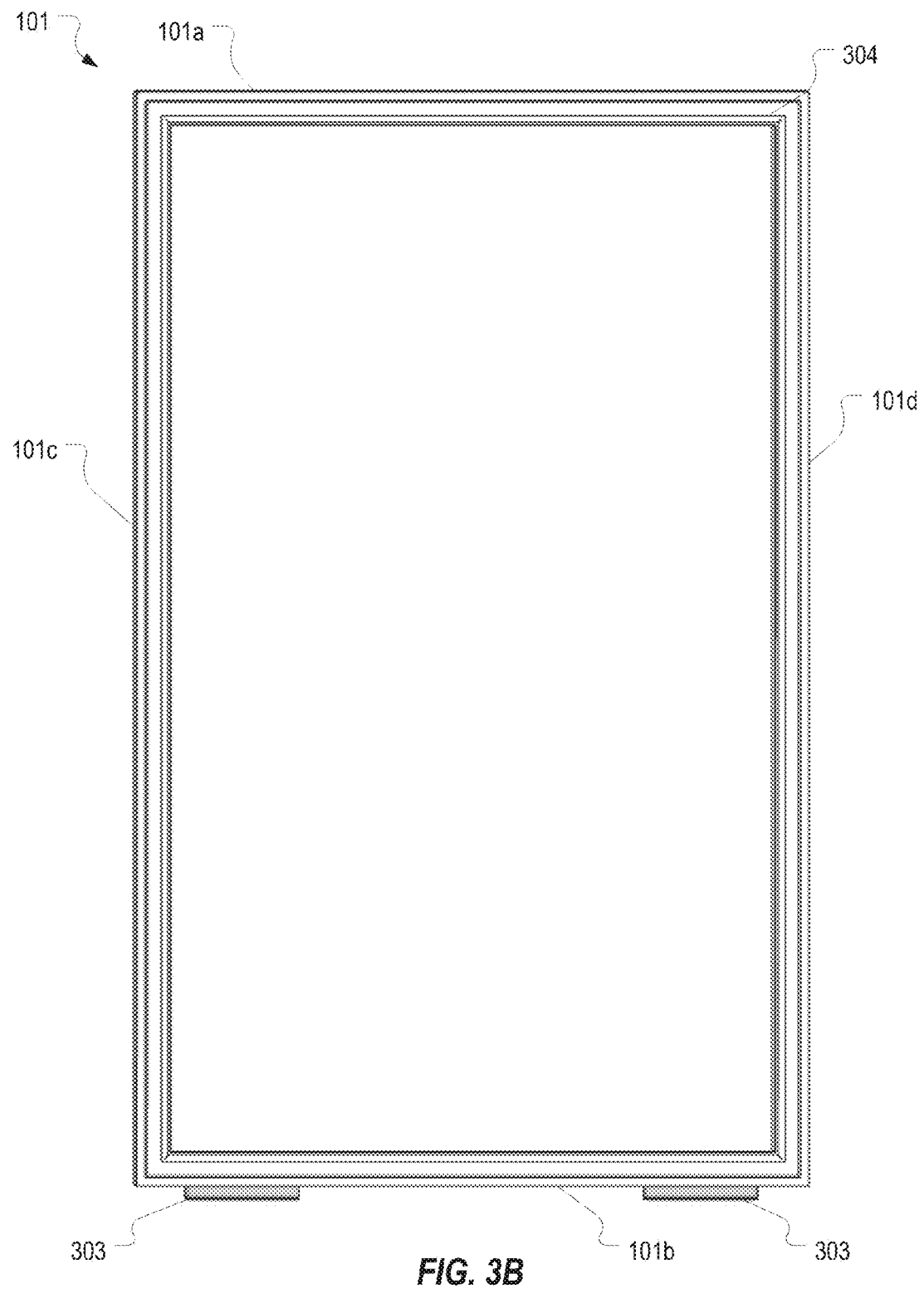
FIG. 3B illustrates a front view of the outer component.
Figure 3C:
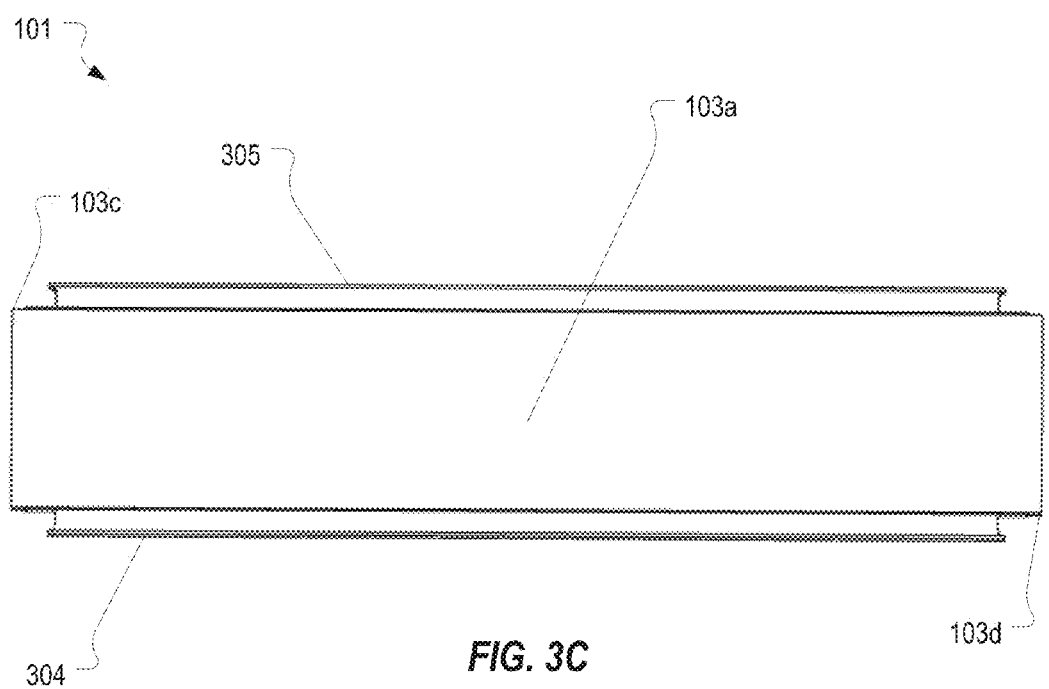
FIG. 3C illustrates a top view of the outer component.
Figure 3D:
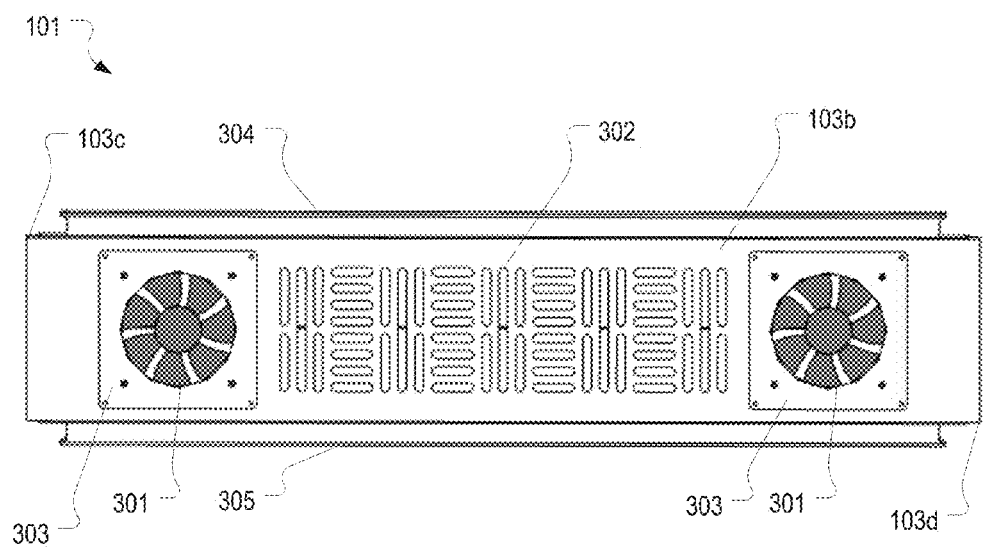
FIG. 3D illustrates a bottom view of the outer component.
Figure 3E:
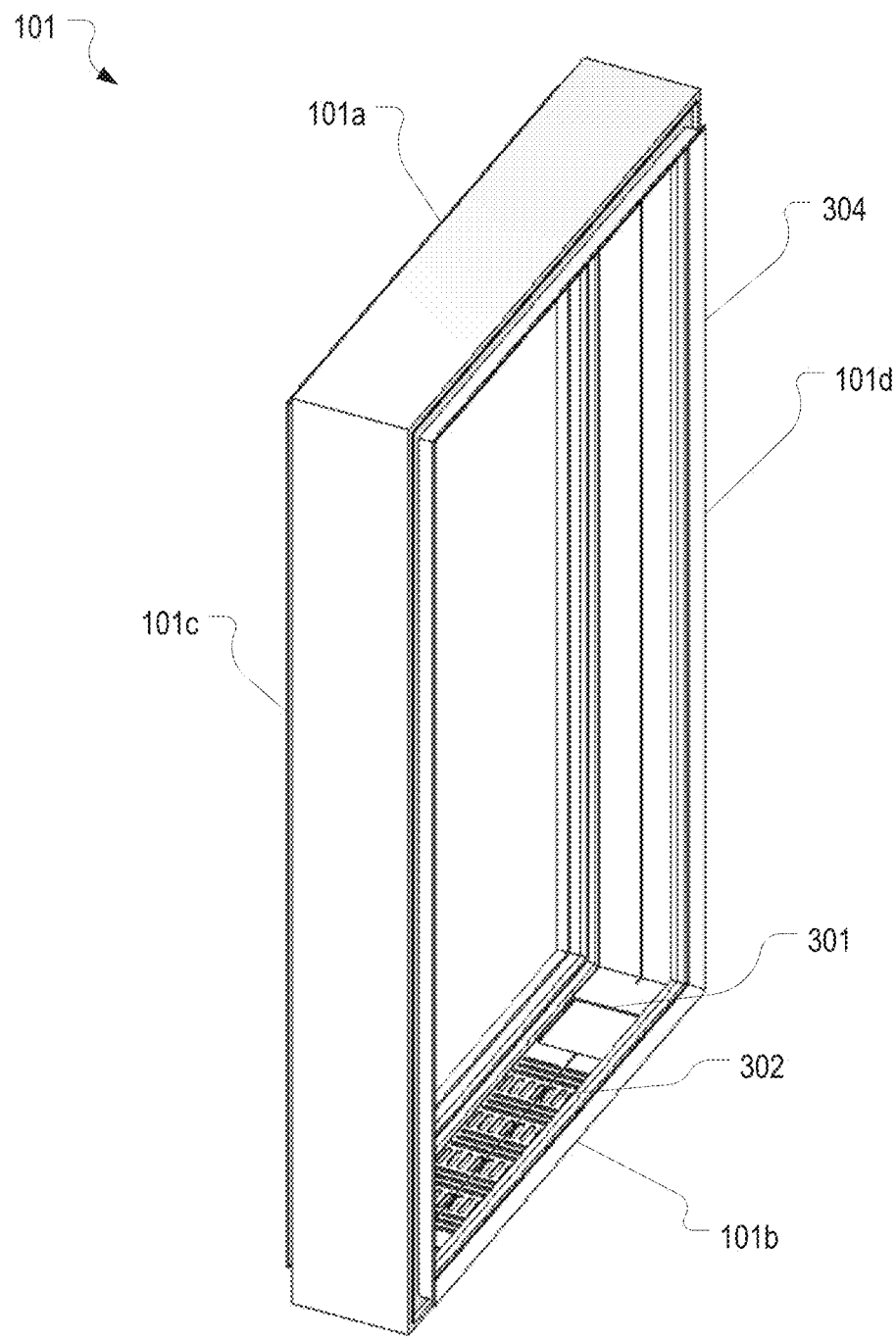
FIG. 3E illustrates a front perspective view of the outer component with the fans removed.

Bottom side 101*b* of outer component 101 includes a number of openings 301, 302 as best seen in FIGS. 3D and 3E. Openings 301 are positioned towards left side 101*c* and right side 101*d* and form airflow outlets from the exhaust channel formed by recessed surfaces 201, 202. In other words, openings 301 are positioned within bottom side 101*b* below recessed surfaces 201, 202. In some embodiments, openings 301 could alternately be formed within left side 101*c* and right side 101*d* near bottom side 101*b*. However, positioning holes 301 within bottom side 101*b* can be preferable since it allows air to flow out of the exhaust channel along the same direction as the air flows within the exhaust channel.

Openings 302 are positioned within a middle portion of bottom side 101*b* and correspond with the location of inlet area 208. In other words, air flowing through openings 302 will also flow through openings 203 and into compartment 210. Some of openings 302 can be configured to receive extensions 207 as described above.

Figure 4:
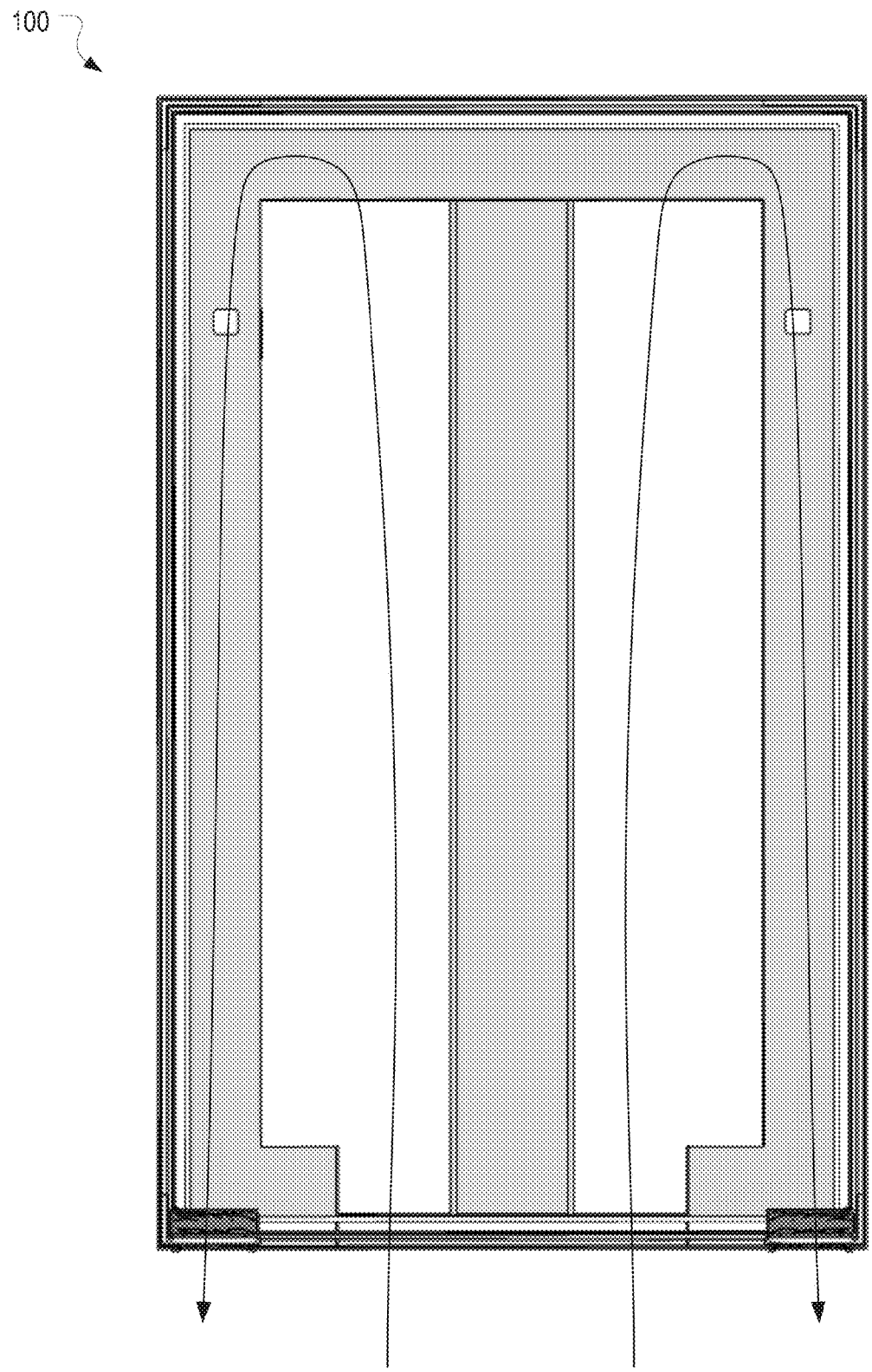
FIG. 4 illustrates a front sectional view of the display enclosure.

Fans 303 can be coupled to bottom side 101*b* within openings 301 to encourage air flow through the exhaust channel. In particular, fans 303 can be configured to blow air in a downward direction thereby causing air within the exhaust channel to be expelled from display enclosure 100 through openings 301. This downward airflow within the exhaust channel will likewise cause upward airflow within compartment 210 and, as a result, airflow through openings 302, 203. This upward-then-downward airflow within display enclosure 100 is shown in FIG. 4.

As can be seen, the exhaust channel formed by recessed surfaces 201, 202 allows display enclosure 100 to be effectively cooled using only fans 303 as opposed to using refrigeration or other active components. This design can be particularly beneficial in outdoor or other non-controlled environments. Additionally, this design can be particularly beneficial for use with display devices that are designed to be used outdoors in daylight or in other bright environments (such display devices are oftentimes referred to as high bright displays).

Another benefit provided by the exhaust channel is that, by being positioned around the exterior of display enclosure 100, the exhaust channel acts as an insulative barrier to external heat such as sunlight or ambient air. For example, if display enclosure 100 is positioned outdoors in a location where sunlight will shine on it, the heat absorbed by the exterior surface of outer component 101 will be transferred into the exhaust channel and removed from the display enclosure by the flowing air. Accordingly, by forming recessed surfaces 201, 202 around the top and sides of the display enclosure (i.e., around the sides that will likely be subject to sunlight), heat generated internally (i.e., by the display device) as well as externally (i.e., by sunlight or ambient heat) can be removed using the same passive cooling system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed:

1. A display enclosure comprising:
   an inner component and an outer component, each of the inner component and the outer component having a first side, a second side opposite the first side, a third side extending between the first and second sides, and a fourth side extending between the first and second sides opposite the third side, the inner component being configured to fit within the outer component;
   the inner component including a first recessed surface and a second recessed surface that each extend along the first, third, and fourth sides of the inner component as well as along outer portions of the second side of the inner component such that the first and second recessed surfaces do not extend along a middle portion of the second side of the inner component, the first and second recessed surfaces forming an exhaust channel between the inner component and the outer component when the inner component is installed within the outer component, the middle portion of the second side of the inner component including a first set of openings forming vents into a compartment defined by the first and second recessed surfaces, one or both of the first and second recessed surfaces including a second set of openings forming airflow inlets into the exhaust channel, the second set of openings being positioned on or adjacent to the first side of the inner component;
   the second side of the outer component including a third set of openings positioned within a middle portion of the second side of the outer component, the third set of openings corresponding to the first set of openings such that air flowing through the third set of openings flows through the first set of openings, the second side of the outer component further including a fourth set of openings positioned at opposing ends of the second side such that each opening in the fourth set is positioned within the exhaust channel and forms and airflow outlet from the exhaust channel.

2. The display enclosure of claim 1, further comprising:
   a fan positioned within each opening of the fourth set of openings, each fan being configured to cause air to flow out of the exhaust channel.

3. The display enclosure of claim 2, wherein the fourth set of openings are formed within the second side of the outer component.

4. The display enclosure of claim 1, wherein the first and second recessed surfaces extend along the full length of the first side of the inner component.

5. The display enclosure of claim 1, wherein the first and second recessed surfaces extend along a portion of the first side.

6. The display enclosure of claim 1, wherein the second side of the inner component includes one or more extensions that extend outwardly from the second side, the one or more extensions each being configured to insert within a corresponding opening of the third set of openings.

7. The display enclosure of claim 1, wherein the second recessed surface has a greater depth than the first recessed surface.

8. The display enclosure of claim 7, wherein the first recessed surface is configured to have inner dimensions that correspond to outer dimensions of a digital display device such that the exhaust channel formed by the first and second recessed surfaces is configured to extend around outer edges of the digital display device and partially behind a back surface of the digital display device.

9. The display enclosure of claim 1, wherein the second set of openings includes one or more openings formed on the first side of the inner component.

10. The display enclosure of claim 9, wherein the one or more openings of the second set of openings that are formed on the first side are formed in the first recessed surface.

11. The display enclosure of claim 9, wherein the one or more openings of the second set of openings that are formed on the first side are formed in the second recessed surface.

12. The display enclosure of claim 1, wherein the second set of openings includes one or more openings formed on the third side and one or more openings formed on the fourth side.

13. The display enclosure of claim 12, wherein the one or more openings of the second set that are formed on the third and fourth sides are formed in the second recessed surface.

14. The display enclosure of claim 1, wherein the inner component includes a fifth set of openings that are formed in a back surface of the inner component, the fifth set of openings forming airflow inlets into the exhaust channel.

15. The display enclosure of claim 1, further comprising:
    a back cover configured to couple to a back surface of the outer component.

16. The display enclosure of claim 1, further comprising:
    a front cover configured to couple to a front surface of the outer component, the front cover forming an opening through which a display contained within the display enclosure can be viewed.

17. The display enclosure of claim 1, further comprising:
    a mounting channel for mounting a display within the display enclosure.

18. A display enclosure comprising:
    an inner component and an outer component, each of the inner component and the outer component having a top side, a bottom side, a left side, and a right side, the inner component being configured to fit within the outer component;
    the inner component including a first recessed surface and a second recessed surface that each extend along the top, left, and right sides of the inner component as well as along outer portions of the bottom side of the inner component such that the first and second recessed surfaces do not extend along a middle portion of the bottom side of the inner component, the first and second recessed surfaces forming an exhaust channel between the inner component and the outer component when the inner component is installed within the outer component, the middle portion of the bottom side of the inner component including a first set of openings forming vents into a compartment defined by the first and second recessed surfaces;

the bottom side of the outer component including a third set of openings positioned within a middle portion of the bottom side of the outer component, the third set of openings corresponding to the first set of openings such that air flowing through the third set of openings flows through the first set of openings;

exhaust channel outlets formed in the bottom side of the outer component, the exhaust channel outlets being positioned at opposing ends of the bottom side of the outer component so as to be underneath the outer portions of the bottom side of the inner component along which the first and second recessed surfaces extend; and exhaust channel inlets formed in either or both the first and second recessed surfaces on the top side of the inner component.

19. The display enclosure of claim 18, wherein the exhaust channel inlets are also formed in the second recessed surface on the left and right sides of the inner component.

* * * * *